United States Patent
Sarin et al.

(10) Patent No.: US 8,488,385 B2
(45) Date of Patent: *Jul. 16, 2013

(54) REDUCING NOISE IN SEMICONDUCTOR DEVICES

(75) Inventors: Vishal Sarin, Cupertino, CA (US); Frankie F. Roohparvar, Monte Sereno, CA (US); Jung Sheng Hoei, Freemont, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/308,976

(22) Filed: Dec. 1, 2011

(65) Prior Publication Data

US 2012/0069675 A1     Mar. 22, 2012

Related U.S. Application Data

(63) Continuation of application No. 11/853,578, filed on Sep. 11, 2007, now Pat. No. 8,085,596.

(51) Int. Cl.
*G11C 11/34* (2006.01)
*G11C 16/04* (2006.01)

(52) U.S. Cl.
USPC .......... 365/185.19; 365/185.18; 365/185.03

(58) Field of Classification Search
USPC .................. 365/185.18, 185.19, 185.03
See application file for complete search history.

(56) References Cited

U.S. PATENT DOCUMENTS

| | | |
|---|---|---|
| 5,909,390 A | 6/1999 | Harari |
| 6,091,636 A | 7/2000 | Liu et al. |
| 6,195,289 B1 | 2/2001 | Pasotti et al. |
| 6,337,808 B1 | 1/2002 | Forbes |
| 6,456,527 B1 | 9/2002 | Campardo et al. |
| 6,542,404 B2 * | 4/2003 | Pierin et al. .............. 365/185.03 |
| 6,850,441 B2 * | 2/2005 | Mokhlesi et al. ........ 365/185.19 |
| 7,012,468 B2 | 3/2006 | Brederlow et al. |
| 7,092,292 B2 | 8/2006 | Mokhlesi et al. |
| 7,196,312 B2 | 3/2007 | Shizukuishi |
| 7,200,041 B2 | 4/2007 | Marotta et al. |
| 7,324,381 B2 | 1/2008 | Gallo et al. |
| 7,463,514 B1 * | 12/2008 | Haque ..................... 365/185.03 |
| 8,085,596 B2 * | 12/2011 | Sarin et al. .............. 365/185.19 |
| 2006/0245245 A1 | 11/2006 | Mokhlesi et al. |
| 2007/0002630 A1 | 1/2007 | Gallo et al. |
| 2009/0190406 A1 | 7/2009 | Tanzawa |

FOREIGN PATENT DOCUMENTS

| | | |
|---|---|---|
| EP | 1466331 A2 | 10/2004 |
| JP | 2000-235799 | 8/2000 |
| JP | 2006-318584 | 11/2006 |
| JP | 2007-058966 | 3/2007 |

(Continued)

OTHER PUBLICATIONS

Cho, Myoung Kwan, "International Search Report" from related PCT Application PCT/US2008/010047, mailed Jan. 23, 2009 (3 pp.).

(Continued)

*Primary Examiner* — Kretelia Graham
(74) *Attorney, Agent, or Firm* — Brooks, Cameron & Huebsch, PLLC

(57) ABSTRACT

The present disclosure includes methods, devices, modules, and systems for reducing noise in semiconductor devices. One method embodiment includes applying a reset voltage to a control gate of a semiconductor device for a period of time. The method further includes sensing the state of the semiconductor device after applying the reset voltage.

20 Claims, 6 Drawing Sheets

FOREIGN PATENT DOCUMENTS

| | | |
|---|---|---|
| JP | 2007-102900 | 4/2007 |
| KR | 1020040081462 | 9/2004 |
| WO | 96/14638 | 5/1996 |
| WO | 2005/073979 | 8/2005 |

OTHER PUBLICATIONS

Forbes, L. et al. "1/f Noise and RTS (Random Telegraph Signal) Errors in Comparators and Sense Amplifiers," http:www/nsti.org/Nanotech2007/showabstract.html?absno=1489, Chapter 9, May 20-24, 2007, pp. 212-243.

Koh, Jeongwook et al. "A Complementary Switched MOSFET Architecture for the 1/f Noise Reduction in Linear Analog CMOS ICs," IEEE Journal of Solid-State Circuits, vol. 42, No. 6, Jun. 2007 (10 pp.).

Simoen, E. et al. "Combined low-frequency noise and random telegraph signal analysis of silicon MOSFET's," Applied Surface Science 63, North Holland, Jan. 1993, pp. 285-290.

Tian, Hui et al. "Analysis of 1/f Noise in Switched MOSFET Circuits," IEEE Transactions on Circuits and Systems-II: Analog and Digital Signal Processing, vol. 48, No. 2, Feb. 2001, pp. 151-157.

European Search Report for related EP Application No. 08830015.7, mailed Oct. 21, 2010 (8 pp.).

Korean Intellectual Property Office's Notice of Preliminary Rejection for related Korean Application 10-2010-7007856, dated May 15, 2011 (9 pp.).

Japanese Notice of Rejection Grounds for related JP Application No. 2010-523995, mailed Jul. 3, 2012, (6 pages).

\* cited by examiner

| | | 561 ERASE | 562 PROGRAM (WL-15) | 563 RESET (WL-15) | 564 READ RAMP (WL-15) | 565 READ DISCRETE (WL-15) |
|---|---|---|---|---|---|---|
| BL | BL | FLOATING | 0 V/Vcc | 1.0 V | 1.0 V | 1.0 V |
| | SGD | FLOATING | Vcc→1.0 V | Vpass_r (4.5 V) | Vpass_read (4.5 V) | Vpass_read (4.5 V) |
| | WL-31 | 0 V | Vpass (10 V) | Vpass_r | Vpass_read | Vpass_read |
| | WL-30 | 0 V | Vpass | Vpass_r | Vpass_read | Vpass_read |
| ⋮ | ⋮ | | | | | |
| | WL-15 | 0 V | Vpgm | Vreset (-4V) | Vramp | Vread |
| ⋮ | ⋮ | | | | | |
| | WL-1 | 0 V | Vpass | Vpass_r | Vpass_read | Vpass_read |
| | WL-0 | 0 V | Vpass | Vpass_r | Vpass_read | Vpass_read |
| | SGS | FLOATING | 0 V | Vpass_r | Vpass_read | Vpass_read |
| | SOURCE | FLOATING | Vcc | 0 V | 0 V | 0 V |
| | P-well (+N-well) | Vera=20 V | 0 V | 0 V | 0 V | 0 V |

*Fig. 5*

REDUCING NOISE IN SEMICONDUCTOR DEVICES

CROSS-REFERENCE TO RELATED APPLICATION

This application is a Continuation of U.S. application Ser. No. 11/853,578, filed Sep. 11, 2007, now U.S. Pat. No. 8,085,596, issued Dec. 27, 2011, the specification of which is incorporated herein by reference.

TECHNICAL FIELD

The present disclosure relates generally to semiconductor devices and, more particularly, in one or more embodiments, to operating non-volatile multilevel memory cells.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory, among others.

Flash memory devices are utilized as non-volatile memory for a wide range of electronic applications. Flash memory devices typically use a one-transistor memory cell that allows for high memory densities, high reliability, and low power consumption.

Uses for flash memory include memory for personal computers, personal digital assistants (PDAs), digital cameras, and cellular telephones. Program code and system data, such as a basic input/output system (BIOS), are typically stored in flash memory devices. This information can be used in personal computer systems, among others.

Two common types of flash memory array architectures are the "NAND" and "NOR" architectures, so called for the logical form in which the basic memory cell configuration of each is arranged A NAND array architecture arranges its array of floating gate memory cells in a matrix such that the gates of each floating gate memory cell of the array are coupled by rows to select lines. However each memory cell is not directly coupled to a column sense line by its drain. Instead, the memory cells of the array are coupled together in series, source to drain, between a source line and a column sense line.

Memory cells in a NAND array architecture can be programmed to a desired state. That is, electric charge can be placed on or removed from the floating gate of a memory cell to put the cell into a number of stored states. For example, a single level cell (SLC) can represent two digit, e.g., binary, states, e.g., 1 or 0. Flash memory cells can also store more than two digit states, e.g., 1111, 0111, 0011, 1011, 1001, 0001, 0101, 1101, 1100, 0100, 0000, 1000, 1010, 0010, 0110, and 1110. Such cells may be referred to as multi state memory cells, multidigit cells, or multilevel cells (MLCs). MLCs can allow the manufacture of higher density memories without increasing the number of memory cells since each cell can represent more than one digit, e.g., bit. MLCs can have more than one programmed state, e.g., a cell capable of representing four digits can have sixteen programmed states. For some MLCs, one of the sixteen programmed states can be an erased state. For these MLCs, the lowermost program state is not programmed above the erased state, that is, if the cell is programmed to the lowermost state, it remains in the erased state rather than having a charge applied to the cell during a programming operation. The other fifteen states can be referred to as "non-erased" states.

As NAND flash memory is scaled to smaller sizes, e.g. from 70 nm to 50 nm to 35 nm, the effects of random telegraph signal (RTS) noise, also known as 1/f noise because it is inversely proportional to the frequency f, can become more severe. When a memory cell is sensed, the sensing current can jump due to RTS. For example, if a sensing current typically would be 500 nA, it could jump from 425 nA to 565 nA randomly. These jumps are sometimes referred to as "quantum jumps." If some cases, quantum jumps can cause sensing errors, e.g., errors in measuring current associated with sensing the state of a memory cell.

The printed publication by Hui Tian and Abbas El Gamal, "Analysis of 1/f Noise in Switched MOSFET Circuits", IEEE Transactions on Circuits and Systems-II: Analog and Digital Signal Processing, Vol. 38, No. 2, pages 151-157, February 2001, reflects the prevailing theory behind RTS noise, suggesting that it can be caused by forming and filling traps in memory cell gate dielectrics, e.g., silicon-oxide interfaces.

Experimentation has shown that turning a semiconductor device off can release charge carriers, e.g., electrons from traps. Trapped charge carriers can block the flow of other carriers across the dielectric. Forming traps can be a slow process as compared to filling a formed trap. Some operating methods designed to combat RTS noise involve turning the device on and off multiple times, e.g., 100 times, and measuring the average current to determine an approximate variation due to RTS. Such operating methods can result in slower sensing operations.

BRIEF DESCRIPTION OF THE DRAWINGS

FIG. 5 illustrates a table of operating voltages in accordance with one or more embodiments of the present disclosure.

DETAILED DESCRIPTION

One or more embodiments of the present disclosure provide methods, devices, and systems for reducing noise in semiconductor devices. One method embodiment includes applying a reset voltage to a control gate of a semiconductor device for a period of time. The method further includes sensing the state of the semiconductor device after applying the reset voltage.

In the following detailed description of the present disclosure, reference is made to the accompanying drawings that form a part hereof, and in which is shown by way of illustration how some embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. Although reference is often made herein to memory devices, embodiments of the present disclosure can be applied by one of ordinary skill in the art to semiconductor devices generally.

Figure 1:
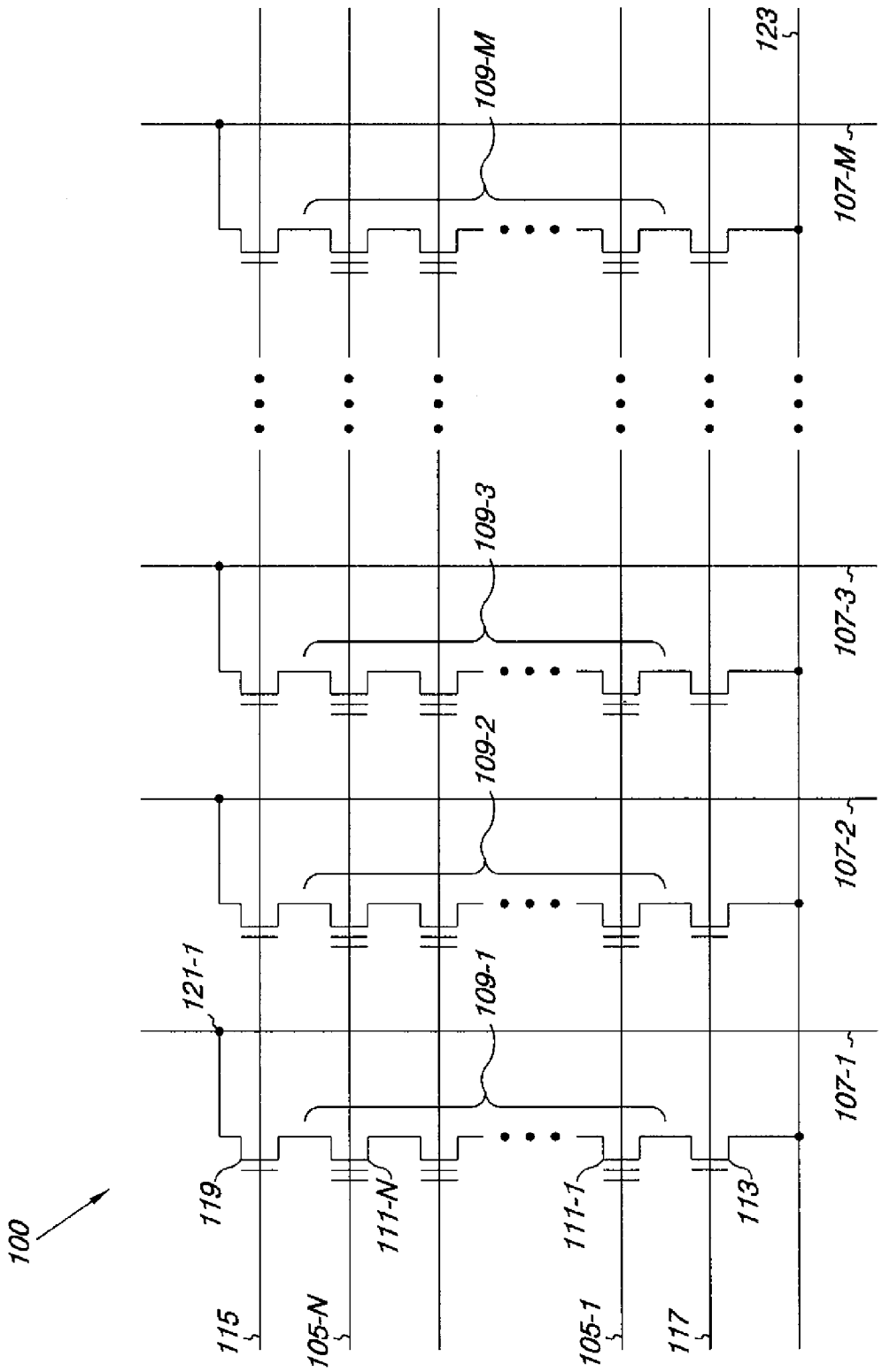
FIG. 1 is a schematic of a portion of a non-volatile memory array that can be used with one or more embodiments of the present disclosure.

FIG. 1 is a schematic of a portion of a non-volatile memory array 100. The embodiment of FIG. 1 illustrates a NAND architecture non-volatile memory. However, embodiments described herein are not limited to this example. As shown in FIG. 1, the memory array 100 includes select lines 105-1, . . . , 105-N and intersecting sense lines 107-1, . . . , 107-M. For ease of addressing in the digital environment, the number of select lines 105-1, . . . , 105-N and the number of sense lines 107-1, . . . , 107-M are each some power of two, e.g., 256 select lines by 4,096 sense lines.

Memory array 100 includes NAND strings 109-1, . . . , 109-M. Each NAND string includes non-volatile memory cells 111-1, . . . , 111-N, each located at an intersection of a select line 105-1, . . . , 105-N and a local sense line 107-1, . . . , 107-M. The non-volatile memory cells 111-1, . . . , 111-N of each NAND string 109-1, . . . , 109-M are connected in series source to drain between a source select gate (SGS), e.g., a field-effect transistor (FET) 113, and a drain select gate (SGD), e.g., FET 119. Source select gate 113 is located at the intersection of a local sense line 107-1 and a source select line 117 while drain select gate 119 is located at the intersection of a local sense line 107-1 and a drain select line 115.

As shown in the embodiment illustrated in FIG. 1, a source of source select gate 113 is connected to a common source line 123. The drain of source select gate 113 is connected to the source of the memory cell 111-1 of the corresponding NAND string 109-1. The drain of drain select gate 119 is connected to the local sense line 107-1 for the corresponding NAND string 109-1 at drain contact 121-1. The source of drain select gate 119 is connected to the drain of the last memory cell 111-N, e.g., floating-gate transistor, of the corresponding NAND string 109-1.

In some embodiments, construction of non-volatile memory cells, 111-1, . . . , 111-N, includes a source, a drain, a floating gate or other charge storage layer, and a control gate. Non-volatile memory cells, 111-1, . . . , 111-N, have their control gates coupled to a select line, 105-1, . . . , 105-N respectively. A column of the non-volatile memory cells, 111-1, . . . , 111-N, make up the NAND strings, e.g., 109-1, . . . , 109-M, coupled to a given local sense line, e.g., 107-1, . . . , 107-M respectively. A row of the non-volatile memory cells are commonly coupled to a given select line, e.g., 105-1, . . . , 105-N. A NOR array architecture would be similarly laid out except that the string of memory cells would be coupled in parallel between the select gates.

As one of ordinary skill in the art will appreciate, subsets of cells coupled to a selected select line, e.g., 105-1, . . . , 105-N, can be programmed and/or sensed together as a group. A programming operation, e.g., a write operation, can include applying a number of program pulses, e.g., 16V-20V, to a selected select line in order to increase the threshold voltage (Vt) of selected cells to a desired program voltage level corresponding to a desired program state.

A sensing operation, such as a read or program verify operation, can include sensing a voltage and/or current change of a sense line coupled to a selected cell in order to determine the state of the selected cell. The sensing operation can involve biasing a sense line, e.g., sense line 107-1, associated with a selected memory cell at a voltage above a bias voltage for a source line, e.g., source line 123, associated with the selected memory cell. A sensing operation could alternatively include precharging the sense line 107-1 followed with discharge when a selected cell begins to conduct, and sensing the discharge. A sensing operation can also include applying a reset voltage, e.g., −4V, to the select line, e.g., select line 105-1, and thus to the control gate, associated with a selected memory cell for a period of time prior to sensing the state of the selected cell.

The sensing operation can include sensing the state of a selected memory cell after applying a reset voltage. Sensing the state of a selected cell can include applying a sensing voltage ramp, e.g., −2V to +3V, to a selected select line, while biasing the unselected cells of the string at a voltage, e.g., 4.5V, sufficient to place the unselected cells in a conducting state independent of the threshold voltage of the unselected cells. Alternatively, sensing the state of a selected cell could include applying discrete sensing voltages, e.g., 0.5V, 2V, and −0.5V, to a selected select line, and thus to the control gate of a selected cell. The sense line corresponding to the selected cell being read/verified can be sensed to determine whether or not the selected cell conducts in response to the particular sensing voltage applied to the selected select line. For example, the state of a selected cell can be determined by the select line voltage at which the sense line current reaches a particular reference current associated with a particular state.

As one of ordinary skill in the art will appreciate, in a sensing operation performed on a selected memory cell in a NAND string, the unselected memory cells of the string are biased so as to be in a conducting state. An example of operating voltages associated with a sensing operation is shown in FIG. 5. In such a sensing operation, the data stored in the selected cell can be based on the current and/or voltage sensed on the bit line corresponding to the string. For instance, data stored in the selected cell can be based on whether the bit line current changes by a particular amount or reaches a particular level in a given time period.

When the selected cell is in a conductive state, current flows between the source line contact at one end of the string and a bit line contact at the other end of the string. As such, the current associated with sensing the selected cell is carried through each of the other cells in the string, the diffused regions between cell stacks, and the select transistors.

Figure 2A:
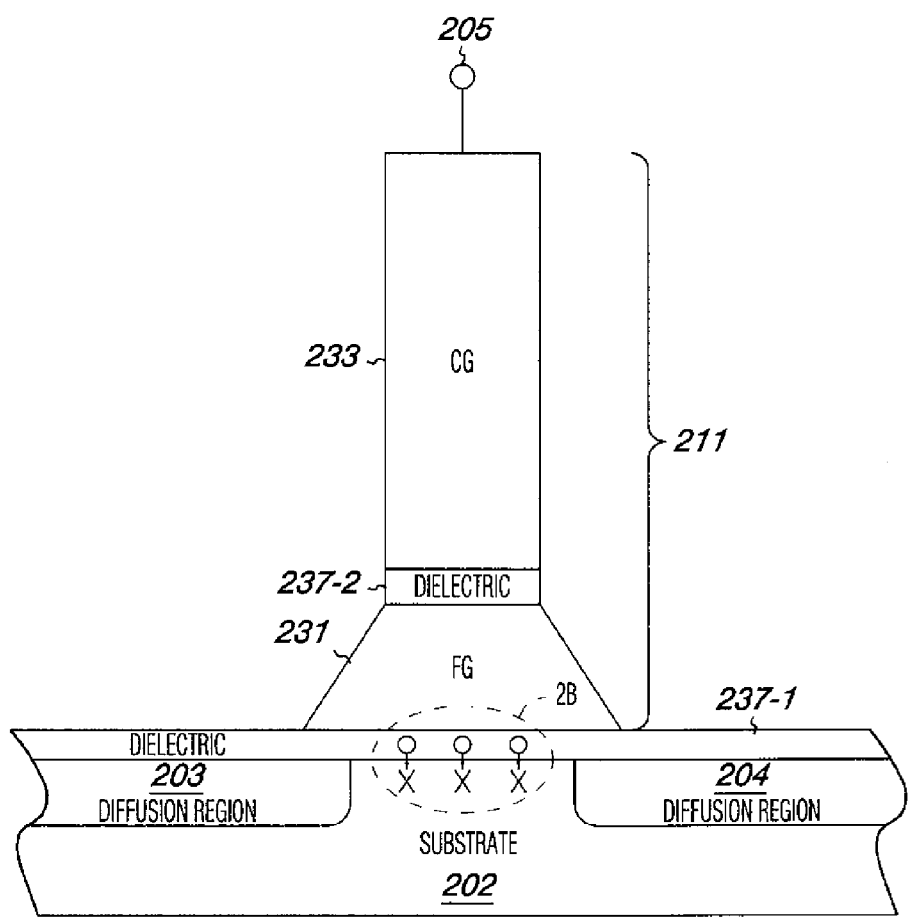
FIG. 2A illustrates a cross-sectional diagram of a memory cell in accordance with one or more embodiments of the present disclosure.

FIG. 2A illustrates a cross-sectional diagram of a memory cell 211 in accordance with one or more embodiments of the present disclosure. In the diagram illustrated in FIG. 2A, the memory cell 211 is a non-volatile memory cell in a NAND array, such as array 100 in FIG. 1. As shown in the diagram illustrated in FIG. 2A, the memory cell 211 has a gate stack configuration including a control gate (CG) 233 and a floating gate (FG) 231 formed over a substrate 202. In the embodiment illustrated in FIG. 2A, the substrate 202 is a p-type silicon substrate 202 implanted with n-type diffusion regions 203 and 204 that act as the source/drain regions for the memory cell 211. The substrate 202 can be referred to as the substrate body region, e.g., P-well region in this example. In various embodiments, the n-type diffusion regions 203 and 204 are lightly doped n-type, e.g., n-diffusion regions. In some embodiments, the substrate 202 can be an n-type substrate implanted with p-type diffusion regions 203 and 204 such that the substrate body is an N-well region.

As shown in the diagram illustrated in FIG. 2A, a dielectric layer 237-1 is formed on the substrate 202. The floating gates of memory cell 211 can be formed over the dielectric layer 237-1. The dielectric layer 237 can be silicon dioxide or another dielectric material. In various embodiments, the dielectric layer 237 can include a number of layers of the same or different dielectric material(s) and can be located above and/or around the source/drain regions 203 and 204. An additional dielectric layer 237-2 is shown, formed between the floating gate 231 and control gate 233. A select line 205 is connected to the control gate 233 and, although not shown in FIG. 2A, continues to connect each of the control gates of other cells on the select line, e.g., 105-1 in FIG. 1.

Figure 2B:
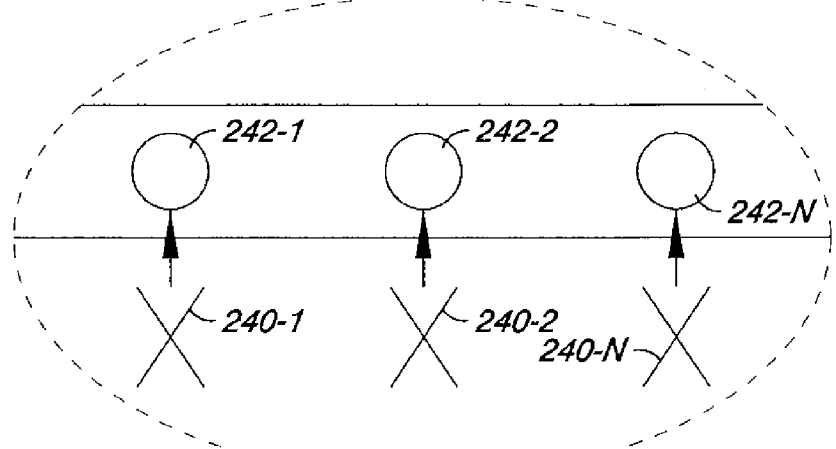
FIG. 2B illustrates an expanded view of a portion of FIG. 2A.

FIG. 2B illustrates an expanded view of a portion of FIG. 2A. The diagram of FIG. 2B illustrates a number of traps, 242-1, 242-2, . . . , 242-N, in the dielectric 237-1 between the substrate 202 and floating gate 231. The diagram also illustrates a number of charge carriers, e.g., electrons 240-1, 240-2, . . . , 240-N, moving into the traps, e.g., trap 242-1, as indicated by the arrows.

It is believed that 1/f noise can be due to forming and filling traps in the dielectric interface region, e.g., oxide region or silicon region around the silicon and oxide interface. Noise, such as 1/f noise, can be observed when sensing the state, e.g., threshold voltage (Vt) level, of a memory cell. For example, if a particular current level for a given memory cell state is 500 nA, the sensed current can jump (quantum jump) from 500 nA, to 565 nA, to 425 nA randomly. This is phenomenon is also called random telegraph signal (RTS), and can cause errors in sensing the state of a memory cell.

As memory cells are scaled down in size, the effects of RTS have a greater impact on accurate sensing of memory cells. In such a situation, the net affect on a sensing current from the trapping and detrapping of carriers can cause the logical data value read from the cells to be different than the logical value written to the cells.

Applying a reset voltage, e.g., negative bias voltage, to the control gate 233 with select line 205 can empty traps in the dielectric interface, e.g., interface between 202 and 237-1. This is also known as detrapping because it can remove electrons from traps, e.g., 242-1. Accumulation is a state when mobile majority carriers are attracted to the dielectric interface. Raising the voltage applied to the control gate 233 with select line 205 can transition the cell from accumulation and through depletion to a state of inversion. Depletion can result from an increased gate voltage depleting the device of mobile carriers at the dielectric interface. Depletion can also create a negative charge, due to ionized acceptor ions, at the dielectric interface. Inversion can occur when a negatively charged layer forms at the dielectric interface due to minority carriers being attracted to the interface by the increased gate voltage.

Applying a reset voltage, e.g., a negative bias voltage, to a control gate of a memory cell can be accomplished by applying a positive boost voltage to a common source line, e.g., 123 in FIG. 1. For instance, a potential of 0V applied to the selected cell and a positive boost voltage, e.g., 1V or 2V, applied to the common source line of the selected cell can result in a gate voltage threshold of −1V or −2V, respectively. The same is described in more detail in copending, commonly assigned U.S. patent application Ser. No. 11/799,657, entitled "Expanded Programming Window for Non-volatile Multi-level Memory Cells", by the same inventors, filed May 2, 2007.

Figure 3:
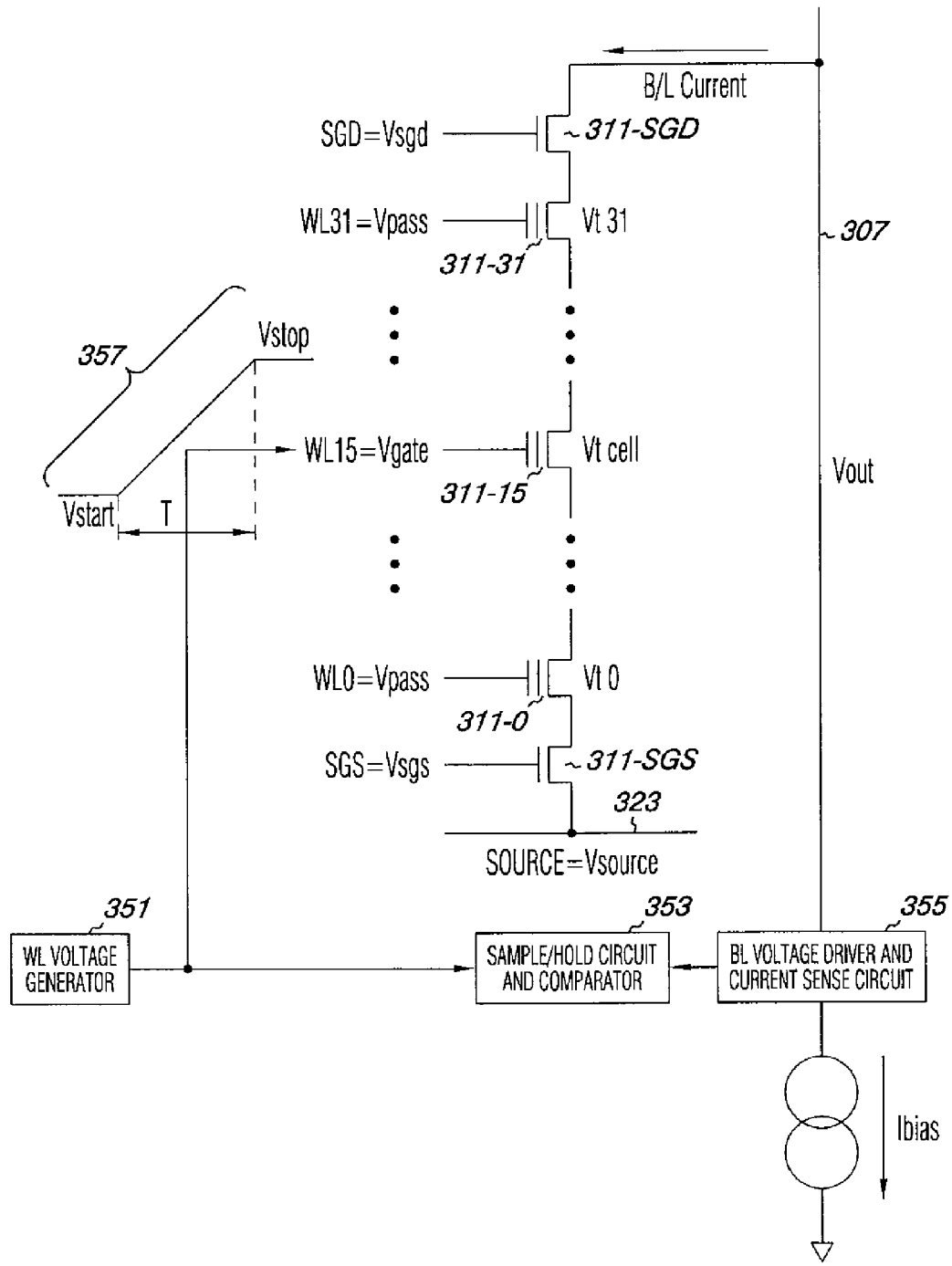
FIG. 3 illustrates a schematic diagram of an operating circuit in accordance with one or more embodiments of the present disclosure.

FIG. 3 illustrates a schematic diagram of an operating circuit in accordance with one or more embodiments of the present disclosure. The embodiment of FIG. 3 illustrates a number of cells 311-SGS, 311-0, . . . , 311-15, . . . , 311-31, 311-SGD, coupled to a sense line 307 during a sensing operation.

In the embodiment illustrated in FIG. 3, the select line, e.g., word line (WL), voltage generator 351 can apply a voltage (Vramp) according to voltage ramp 357 to a select line, e.g., WL15, and thus the control gate of a selected cell, e.g., 311-15. According to this embodiment, the state, e.g. threshold voltage (Vt cell), of the cell can be sensed by detecting changes to the current (B/L Current) and/or voltage (Vout) in the sense line 307 using the sense line, e.g., bit line, voltage driver and current sense circuit 355. The voltage generator 351 can function to ramp the voltage 357 to the point where the applied voltage reaches the Vt of the selected cell 311-15, where the cell is put into a conductive state. When the selected cell is in a conductive state, current flows between the source line 323 and the bit line 307. This current can be sensed by circuit 355 and can be compared to a particular reference current using the sample/hold circuit and comparator 353. The state of the selected memory cell can be read out directly from the voltage generator 351 as an analog value, or converted by an analog to digital converter in circuitry associated with the sample/hold circuit and comparator 353.

As is also indicated in the embodiment illustrated in FIG. 3, select lines, e.g., WL0 and WL31, for non-selected memory cells, e.g., 311-0 and 311-31, have a pass voltage (Vpass) applied during the sensing operation so that they are in a conductive state. As indicated in FIG. 5, this can be Vpass_r during a reset operation and Vpass_read during a reading operation, for example. In this embodiment, the select gate source (SGS) 311-SGS and select gate drain (SGD) 311-SGD are biased at Vsgs and Vsgd respectively. An example table of operating voltages is provided as an example in FIG. 5.

When the selected cell is in a conductive state, current flows between the source line contact at one end of the string and a bit line contact at the other end of the string. As such, the current associated with reading the selected cell is carried through each of the other cells in the string, the diffused regions between cell stacks, and the select transistors. As the reader will appreciate, the embodiment illustrated in FIG. 3 shows one sense line 307 for ease of illustration. However, sensing operations can include sensing multiple sense lines together as a group as described in connection with FIG. 1.

Another embodiment could be used to sense memory cells by applying discrete sensing voltages, instead of a ramp, as described in connection with FIGS. 1, 4B, and 5. Furthermore, the WL voltage generator 351 can be used to apply reset voltages prior to sensing selected memory cells, e.g., 311-15, as described in the present disclosure.

Figure 4A:
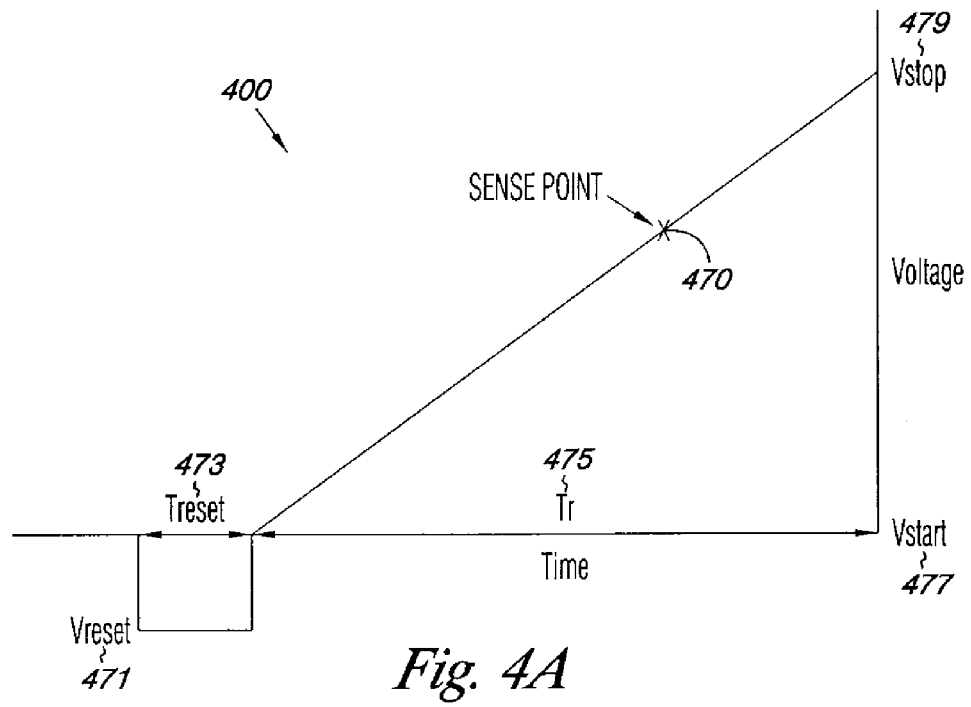
FIG. 4A illustrates a sensing voltage ramp in accordance with one or more embodiments of the present disclosure.

FIG. 4A illustrates a sensing voltage ramp 400 in accordance with one or more embodiments of the present disclosure. As described in connection with FIG. 3, a voltage ramp 400 can be applied to a select line, e.g. 105-1 in FIG. 1, for a selected memory cell, e.g., 311-15 in FIG. 3. The voltage ramp 400 is thus applied to the control gate, e.g., 233 in FIG. 2A, of the selected memory cell, e.g., 311-15 in FIG. 3. The embodiment of FIG. 4A illustrates a reset voltage, "Vreset" 471, applied for a period of time "Treset" 473, before the start of the voltage ramp 400. In some embodiments, Vreset 471 can be below the starting voltage "Vstart" 477 of the voltage ramp 400. The period of the voltage ramp 400 is illustrated as "Tr" 475. As is illustrated in the embodiment of FIG. 4A, the voltage ramp 400 increases up to a stopping voltage "Vstop" 479.

In some embodiments, in order to sense the state of a selected memory cell, Vstart 477 can be lower than the lowermost Vt of a cell in the array, and Vstop 479 can be equal to or greater than the uppermost Vt of a cell in the array. At some point along the voltage ramp 400, the selected memory cell begins to conduct at sense point 470. The use of a voltage ramp to sense the state of a memory cell is described in more detail in a co-pending, commonly assigned U.S. patent application Ser. No. 11/416,672 filed May 3, 2006, entitled "Low Power Multiple Bit Sense Amplifier" and having at least one common inventor. As described in the above referenced U.S. patent application, using a voltage ramp allows for fast sensing operations beneficial to sensing the state of a cell before onset of RTS after a reset operation.

As described in connection with FIGS. 4A and 4B, a reset voltage 471 can be used to expose the memory device to an electric field before each sensing operation for a period of time, Treset 473, sufficiently long to allow for charge detrapping in the dielectric layer and to put the device in a state of accumulation. In the embodiment illustrated in FIG. 4A, the reset voltage can be less than a sensing voltage used to sense a lowermost state of the selected memory cell. In some embodiments, Vreset 471 can be chosen as approximately −4V, −2V, 0V, or another voltage suitable to induce the device to a state of accumulation. In other embodiments, the reset voltage 471 can be equal to the starting voltage 477 of the voltage ramp 400, as long as the reset voltage is sufficiently low to induce the device into a state of accumulation so as to detrap the dielectric interface.

After the reset voltage 471 is applied, control circuitry can jump the voltage level to Vstart 477. This jump in voltage can initiate a transition of the device from a state of accumulation to inversion. A transition from accumulation to inversion can be completed in a period of time substantially less than a period of time associated with RTS and/or 1/f noise so that the state of the selected memory cell can be sensed, in period Tr 475, before charge trapping and detrapping is likely to occur in the gate dielectric of the selected memory cell. Sensing the state of a selected memory cell prior to onset of RTS allows for accurate sensing because quantum jumps in current level, as described above, can be avoided.

The starting voltage 477 can also be low enough to initiate transition of the selected memory cell from accumulation to inversion when the selected memory cell is programmed to a lowermost state. Therefore, Vstart 477 can be less than the Vt for the lowermost state of memory cells in the array.

Figure 4B:
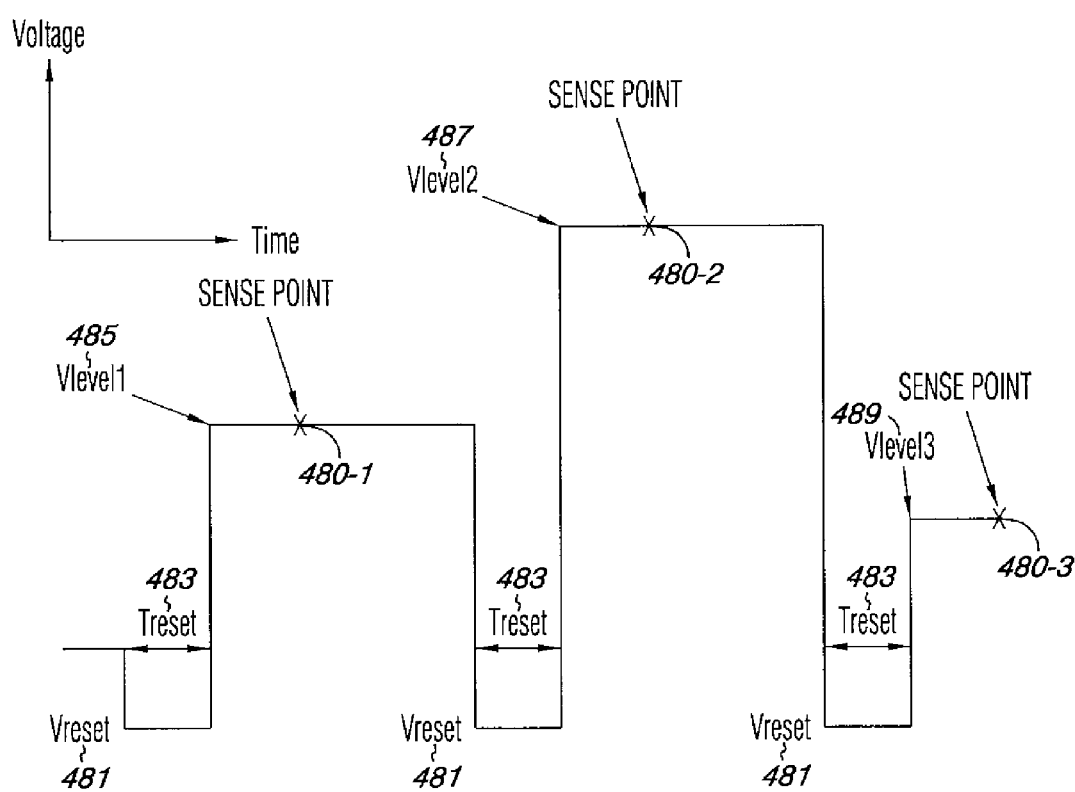
FIG. 4B illustrates discrete sensing voltages in accordance with one or more embodiments of the present disclosure.

FIG. 4B illustrates discrete sensing voltages, Vlevel1 485, Vlevel2 487, and Vlevel3 489, in accordance with one or more embodiments of the present disclosure. In the embodiment illustrated in FIG. 4B, each discrete sensing voltage level is preceded by a reset voltage Vreset 481 for a period Treset 483. Each discrete sensing voltage level is also illustrated with a sensing point, 480-1, 480-2, and 480-3 respectively. The sensing point, e.g., 480-1, is the point where control circuitry for the memory device can determine whether the applied voltage level, e.g., 485, causes the selected memory cell to conduct, e.g., turns the device on and/or off.

As described in connection with FIGS. 2 and 4A, a reset voltage 481 can be used to expose the memory device to an electric field before applying each discrete sensing voltage, e.g., 485, for a period of time, Treset 483, sufficiently long to allow for charge detrapping in the dielectric layer and to put the device in a state of accumulation. In the embodiment illustrated in FIG. 4B, the reset voltage can be less than a sensing voltage used to sense a lowermost state of the selected memory cell. In some embodiments, Vreset 481 can be chosen as approximately −4V, −2V, 0V, or another voltage suitable to induce the device to a state of accumulation. In other embodiments, the reset voltage 481 can be equal to a sensing voltage used to sense a lowermost state of the selected memory cell, as long as the reset voltage is sufficiently low to induce the device into a state of accumulation strong enough to detrap the dielectric interface.

In conventional sensing operations using discrete sensing voltages, the discrete sensing voltages are applied sequentially starting with the discrete sensing voltage used to sense a lowermost state of a selected memory cell. The state of the selected memory cell can be determined by the sensing voltage that causes it to conduct. For example, in a four-state cell, three sensing voltages can be used. If the first sensing voltage causes the selected cell to conduct, it is in the first, or lowermost state. If the second sensing voltage causes the selected cell to conduct, it is in the second state. If the third sensing voltage causes the selected cell to conduct, it is in the third state. If the third sensing voltage does not cause the cell to conduct, it is in the fourth, or uppermost state.

The embodiment of FIG. 4B illustrates a sensing scheme for a four-state cell. A first discrete sensing voltage 485 can be applied to the selected memory cell. The first discrete sensing voltage 485 can be less than a second discrete sensing voltage 487, and greater than a third discrete sensing voltage 489. In the embodiment illustrated in FIG. 4B, if the first discrete sensing voltage 485 does not cause the selected cell to conduct, then it must be in a higher state. In this case, the second discrete sensing voltage 487 can be applied to determine whether the cell is in the uppermost (fourth) state or third state. If the selected cell conducts when the second sensing voltage 487 is applied, it is in the third state. If the selected cell does not conduct when the second sensing voltage is applied, it is in the uppermost (fourth) state.

If the first discrete sensing voltage 485 causes the selected cell to conduct, then it is either in the lowermost state, or the second state. In this case, the third discrete sensing voltage 489 can be applied. If the third discrete sensing voltage 489 causes the selected cell to conduct, it is in the lowermost (first) state. If the third discrete sensing voltage 489 does not cause the cell to conduct, it is in the second state.

FIG. 5 illustrates a table 510 of operating voltages in accordance with one or more embodiments of the present disclosure. The table 510 illustrates voltages applied to a sense line, e.g., bit line (BL), a drain select line (SGD), a number of select lines, e.g., word lines (WL-0 through WL-31), a source select line (SGS), a common source line (SOURCE), and a substrate body (P-well) associated with a string 509 of non-volatile memory cells coupled in series between a select gate source transistor and a select gate drain transistor. The table 510 illustrates examples of voltages applied to the string 509 during an erase operation (ERASE) 561, a program operation (PROGRAM WL-15) 562, a reset operation (RESET (WL-15)) 563, a read operation using a voltage ramp (READ RAMP (WL-15)) 564, and a read operation using discrete sensing voltages (READ DISCRETE (WL-15)) 565, associated with programming, reset, and reading operations of a memory cell of the string 509, e.g., a cell coupled to WL-15 in this example.

In various reset operation embodiments, a sense line (BL) can be biased at a voltage above a source voltage, 1.0V and 0V, respectively, in this example. In some embodiments, and as shown in FIG. 5, a pass voltage (Vpass_r) can be applied to non-selected cells, e.g., 4.5V, in this example. A reset voltage, e.g., −4V, in this example, can be applied to a selected cell, e.g., 511, in this example.

In various sensing, e.g., read, operation embodiments, a sense line (BL) can be biased at a voltage above a source voltage, 1.0V and 0V respectively in this example. In some embodiments, and as shown in FIG. 5, a pass voltage (Vpass_read) can be applied to non-selected cells, 4.5V in this example. A sensing voltage can be applied to a select line, e.g., WL-15, connected to the control gate of a selected memory cell, e.g., 511. As described above in connection with FIGS. 4A and 4B, the sensing voltage applied can take the form of a voltage ramp, "Vramp" in 564, or a series of discrete sensing voltages, "Vread" in 565.

Figure 6:
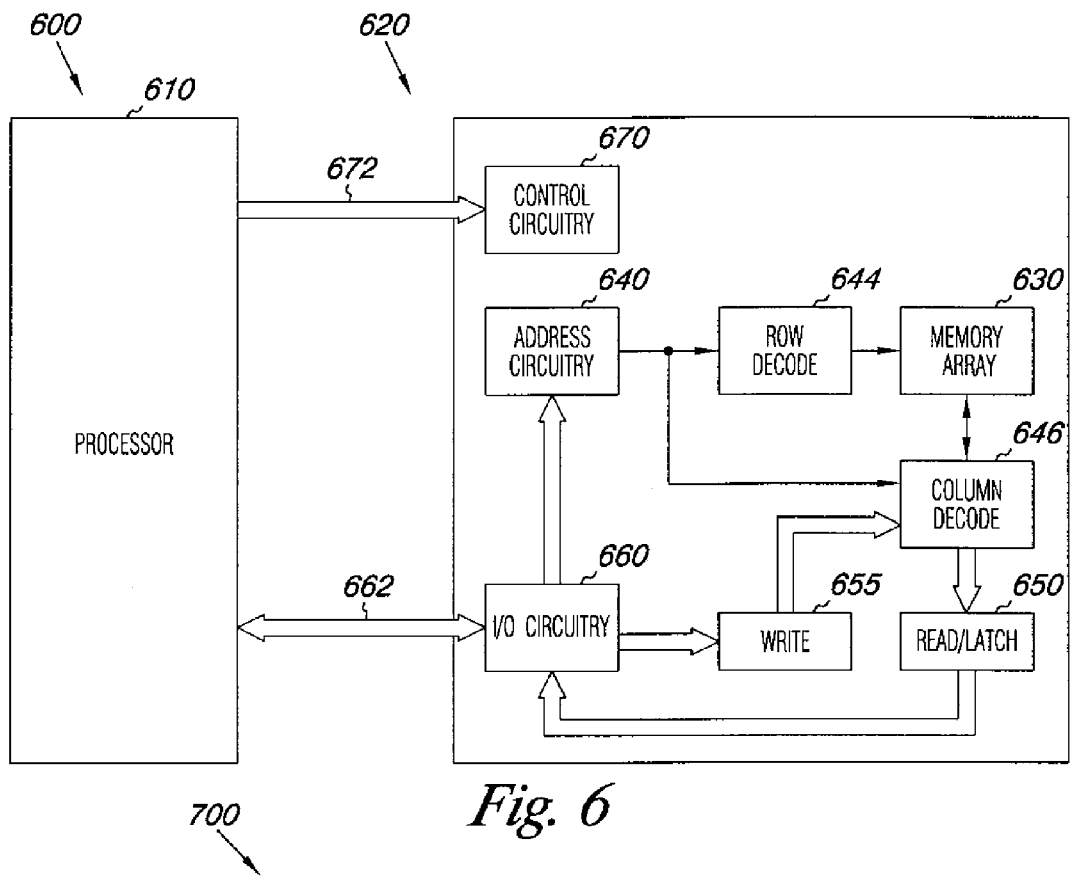
FIG. 6 is a functional block diagram of an electronic memory system having at least one memory device operated in accordance with one or more embodiments of the present disclosure.

FIG. 6 is a functional block diagram of an electronic memory system 600 having at least one memory device 620 operated in accordance with one or more embodiments of the present disclosure. Memory system 600 includes a processor 610 coupled to a non-volatile memory device 620 that includes a memory array 630 of multilevel non-volatile cells. The memory system 600 can include separate integrated circuits or both the processor 610 and the memory device 620 can be on the same integrated circuit. The processor 610 can be a microprocessor or some other type of controlling circuitry such as an application-specific integrated circuit (ASIC).

The memory device 620 includes an array of non-volatile memory cells 630, which can be floating gate flash memory cells with a NAND architecture. The control gates of each row of memory cells are coupled with a select line, while the drain regions of the memory cells are coupled to sense lines. The source regions of the memory cells are coupled to source lines, as the same has been illustrated in FIG. 1. As will be appreciated by those of ordinary skill in the art, the manner of connection of the memory cells to the sense lines and source lines depends on whether the array is a NAND architecture, a NOR architecture, and AND architecture, or some other memory array architecture.

The embodiment of FIG. 6 includes address circuitry 640 to latch address signals provided over I/O connections 662 through I/O circuitry 660. Address signals are received and decoded by a row decoder 644 and a column decoder 646 to access the memory array 630. In light of the present disclosure, it will be appreciated by those skilled in the art that the number of address input connections depends on the density and architecture of the memory array 630 and that the number of addresses increases with both increased numbers of memory cells and increased numbers of memory blocks and arrays.

The memory array 630 of non-volatile cells can include non-volatile multilevel memory cells having different numbers of program states, sensing voltages, and numbers of digits according to embodiments described herein. The memory device 620 senses data in the memory array 630 by sensing voltage and/or current changes in the memory array columns using sense/buffer circuitry that in this embodiment can be read/latch circuitry 650. The read/latch circuitry 650 can read and latch a page or row of data from the memory array 630. I/O circuitry 660 is included for bi-directional data communication over the I/O connections 662 with the processor 610. Write circuitry 655 is included to write data to the memory array 630.

Control circuitry 670 decodes signals provided by control connections 672 from the processor 610. These signals can include chip signals, write enable signals, and address latch signals that are used to control the operations on the memory array 630, including data sensing, data write, and data erase operations. In some embodiments, the control circuitry 670 is responsible for executing instructions from the processor 610 to perform the operations according to embodiments of the present disclosure. The control circuitry 670 can be a state machine, a sequencer, or some other type of controller. It will be appreciated by those skilled in the art that additional circuitry and control signals can be provided, and that the memory device detail of FIG. 6 has been reduced to facilitate ease of illustration.

Figure 7:
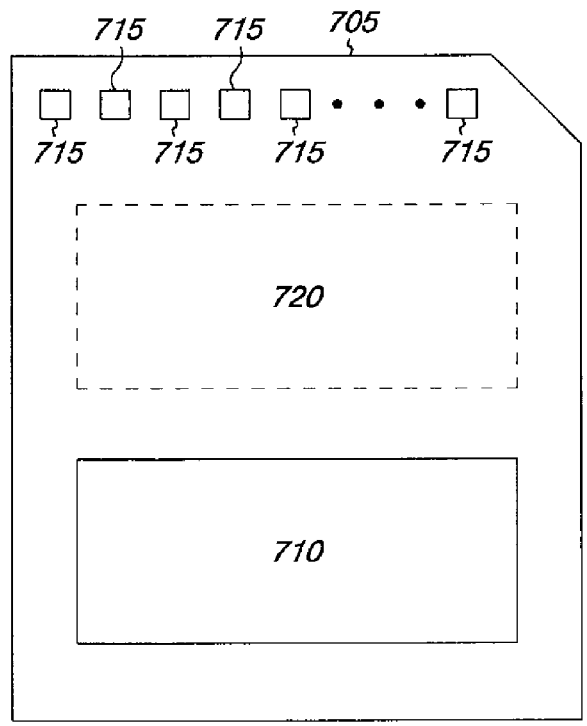
FIG. 7 is a functional block diagram of a memory module having at least one memory device in accordance with one or more embodiments of the present disclosure.

FIG. 7 is a functional block diagram of a memory module having at least one memory device programmed in accordance with one or more embodiments of the present disclosure. Memory module 700 is illustrated as a memory card, although the concepts discussed with reference to memory module 700 are applicable to other types of removable or portable memory (e.g., USB flash drives) and are intended to be within the scope of "memory module" as used herein. In addition, although one example form factor is depicted in FIG. 7, these concepts are applicable to other form factors as well.

In some embodiments, memory module 700 will include a housing 705 (as depicted) to enclose one or more memory devices 710, though such a housing is not essential to all devices or device applications. At least one memory device 710 includes an array of non-volatile multilevel memory cells that can be sensed according to embodiments described herein. Where present, the housing 705 includes one or more contacts 715 for communication with a host device. Examples of host devices include digital cameras, digital recording and playback devices, PDAs, personal computers, memory card readers, interface hubs and the like. For some embodiments, the contacts 715 are in the form of a standardized interface. For example, with a USB flash drive, the contacts 715 might be in the form of a USB Type-A male connector. For some embodiments, the contacts 715 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 715 provide an interface for passing control, address and/or data signals between the memory module 700 and a host having compatible receptors for the contacts 715.

The memory module 700 may optionally include additional circuitry 720, which may be one or more integrated circuits and/or discrete components. For some embodiments, the additional circuitry 720 may include control circuitry, such as a memory controller, for controlling access across multiple memory devices 710 and/or for providing a translation layer between an external host and a memory device 710. For example, there may not be a one-to-one correspondence between the number of contacts 715 and a number of 710 connections to the one or more memory devices 710. Thus, a memory controller could selectively couple an I/O connection (not shown in FIG. 7) of a memory device 710 to receive the appropriate signal at the appropriate I/O connection at the appropriate time or to provide the appropriate signal at the appropriate contact 715 at the appropriate time. Similarly, the communication protocol between a host and the memory module 700 may be different than what is required for access of a memory device 710. A memory controller could then translate the command sequences received from a host into the appropriate command sequences to achieve the desired access to the memory device 710. Such translation may further include changes in signal voltage levels in addition to command sequences.

The additional circuitry 720 may further include functionality unrelated to control of a memory device 710 such as logic functions as might be performed by an ASIC. Also, the additional circuitry 720 may include circuitry to restrict read or write access to the memory module 700, such as password protection, biometrics or the like. The additional circuitry 720 may include circuitry to indicate a status of the memory module 700. For example, the additional circuitry 720 may include functionality to determine whether power is being supplied to the memory module 700 and whether the memory module 700 is currently being accessed, and to display an indication of its status, such as a solid light while powered and a flashing light while being accessed. The additional circuitry 720 may further include passive devices, such as decoupling capacitors to help regulate power requirements within the memory module 700.

CONCLUSION

Methods, devices, modules, and systems for reducing noise in semiconductor devices have been shown. One method embodiment includes applying a reset voltage to a control gate of a semiconductor device for a period of time. The method further includes sensing the state of the semiconductor device after applying the reset voltage.

Although specific embodiments have been illustrated and described herein, those of ordinary skill in the art will appreciate that an arrangement calculated to achieve the same results can be substituted for the specific embodiments shown. This disclosure is intended to cover adaptations or variations of some embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the some embodiments of the present disclosure includes other applications in which the above structures and methods are used. Therefore, the scope of some embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A semiconductor device comprising:
an array of memory cells; and
control circuitry coupled to the array, wherein the control circuitry is operable to:
apply a reset voltage to a control gate of at least one selected memory cell for a time prior to sensing a state of the at least one selected memory cell; and
apply a sensing voltage ramp, from a start voltage to a stop voltage, to the control gate of the at least one selected memory cell to induce the at least one selected memory cell from accumulation to inversion, wherein the start voltage is greater than or equal to the reset voltage, and the stop voltage is equal to or greater than a sensing voltage associated with sensing an uppermost state of memory cells in the array.

2. The device of claim 1, wherein the reset voltage is sufficient to allow for charge detrapping in a dielectric interface of the at least one selected memory cell.

3. The device of claim 1, wherein the reset voltage is equal to or less than a sensing voltage for a lowermost state of the at least one selected memory cell.

4. The device of claim 1, wherein the control circuitry is operable to sense the state of the at least one selected memory cell according to a voltage of the sensing voltage ramp when a drain current reaches a particular reference current.

5. The device of claim 1, wherein the control circuitry is operable to read the sensing voltage ramp by using an analog to digital converter.

6. A semiconductor device comprising:
an array of memory cells; and
control circuitry coupled to the array, wherein the control circuitry is operable to:
apply a reset voltage to a control gate of at least one selected memory cell for a time prior to sensing a state of the at least one selected memory cell, wherein the reset voltage is equal to or less than a sensing voltage associated with sensing a lowermost state of memory cells in the array; and
apply a sensing voltage ramp to the control gate of the at least one selected memory cell to induce the at least one selected memory cell from accumulation to inversion.

7. The device of claim 6, wherein the time is sufficiently long to allow for charge detrapping in a dielectric interface of the at least one selected memory cell such that the at least one selected memory cell is in a state of accumulation.

8. The device of claim 6, wherein the control circuitry is operable to apply the sensing voltage ramp from a start voltage to a stop voltage, and wherein the start voltage is greater than or equal to the reset voltage, and the stop voltage is equal to or greater than a sensing voltage used to sense an uppermost state of the at least one selected memory cell.

9. The device of claim 6, wherein the control circuitry is operable to sense the state of the at least one selected memory cell according to a voltage of the sensing voltage ramp when a drain current reaches a particular reference current.

10. The device of claim 6, wherein the control circuitry is operable to read the sensing voltage ramp by using an analog to digital converter.

11. A semiconductor device comprising:
an array of memory cells; and
control circuitry coupled to the array, wherein the control circuitry is operable to:
apply a reset voltage to a control gate of at least one selected memory cell for a time prior to sensing a state of the at least one selected memory cell, wherein the reset voltage is equal to or less than a sensing voltage associated with sensing a lowermost state of memory cells in the array, and wherein the time is sufficiently long to allow for charge detrapping in a dielectric interface of the at least one selected memory cell such that the at least one selected memory cell is in a state of accumulation; and
apply a sensing voltage ramp to the control gate of the at least one selected memory cell to induce the at least one selected memory cell from accumulation to inversion.

12. The device of claim 11, wherein the reset voltage is sufficient to allow for charge detrapping in a dielectric interface of the at least one selected memory cell.

13. The device of claim 11, wherein the control circuitry is operable to apply the sensing voltage ramp from a start voltage to a stop voltage, and wherein the start voltage is greater than or equal to the reset voltage, and the stop voltage is equal to or greater than a sensing voltage used to sense an uppermost state of the at least one selected memory cell.

14. The device of claim 11, wherein the control circuitry is operable to sense the state of the at least one selected memory cell according to a voltage of the sensing voltage ramp when a drain current reaches a particular reference current.

15. The device of claim 11, wherein the control circuitry is operable to read the sensing voltage ramp by using an analog to digital converter.

16. A semiconductor device comprising:
an array of memory cells; and
control circuitry coupled to the array, wherein the control circuitry is operable to:
apply a reset voltage to a control gate of at least one selected memory cell for a time prior to sensing a state of the at least one selected memory cell, wherein the reset voltage is sufficient to allow for charge detrapping in a dielectric interface of the at least one selected memory cell; and
apply a sensing voltage ramp, from a start voltage to a stop voltage, to the control gate of the at least one selected memory cell to induce the at least one selected memory cell from accumulation to inversion, wherein the start voltage is greater than or equal to the reset voltage, and the stop voltage is equal to or greater than a sensing voltage associated with sensing an uppermost state of memory cells in the array.

17. The device of claim 16, wherein the time is sufficiently long to allow for charge detrapping in a dielectric interface of the at least one selected memory cell such that the at least one selected memory cell is in a state of accumulation.

18. The device of claim 16, wherein the reset voltage is equal to or less than a sensing voltage for a lowermost state of the at least one selected memory cell.

19. The device of claim 16, wherein the control circuitry is operable to sense the state of the at least one selected memory cell according to a voltage of the sensing voltage ramp when a drain current reaches a particular reference current.

20. The device of claim 16, wherein the control circuitry is operable to read the sensing voltage ramp by using an analog to digital converter.

* * * * *

UNITED STATES PATENT AND TRADEMARK OFFICE
CERTIFICATE OF CORRECTION

PATENT NO. : 8,488,385 B2
APPLICATION NO. : 13/308976
DATED : July 16, 2013
INVENTOR(S) : Vishal Sarin et al.

Page 1 of 1

It is certified that error appears in the above-identified patent and that said Letters Patent is hereby corrected as shown below:

On Title Page, Item (75), under "Inventors", column 1, line 3, Delete "Freemont," and insert -- Fremont, --, therefor.

Signed and Sealed this
Twenty-ninth Day of October, 2013

Teresa Stanek Rea
*Deputy Director of the United States Patent and Trademark Office*